US006590284B2

(12) United States Patent
Effing et al.

(10) Patent No.: US 6,590,284 B2
(45) Date of Patent: Jul. 8, 2003

(54) SEMICONDUCTOR DEVICE AND METHOD OF MANUFACTURING SAME

(76) Inventors: Hermanus Johannes Effing, Gerstweg 2, 6534 AE Nijmegen (NL); Alfred Ronnie Hamstra, Gerstweg 2, 6534 AE Nijmegen (NL)

( * ) Notice: Subject to any disclaimer, the term of this patent is extended or adjusted under 35 U.S.C. 154(b) by 52 days.

(21) Appl. No.: 09/851,444

(22) Filed: May 8, 2001

(65) Prior Publication Data

US 2001/0052646 A1 Dec. 20, 2001

(30) Foreign Application Priority Data

May 11, 2000 (EP) ............................................ 00201684

(51) Int. Cl.[7] ............................................... H01L 21/44
(52) U.S. Cl. .................. 257/723; 257/692; 257/528; 257/529; 257/737; 257/738; 257/734; 257/786
(58) Field of Search ................................. 257/528, 529, 257/737, 738, 723, 734, 786

(56) References Cited

U.S. PATENT DOCUMENTS 5,726,489 A * 3/1998 Matsuda et al. ............ 257/659
6,222,212 B1 * 4/2001 Lee et al. ................... 257/207

* cited by examiner

*Primary Examiner*—Nathan J. Flynn
*Assistant Examiner*—Fazli Erdem
(74) *Attorney, Agent, or Firm*—Aaron Waxler

(57) ABSTRACT

The invention relates to a semiconductor device (10) comprising an IC (1) which is attached to one side of an insulating substrate (11) which, on said side, is provided with a first conductor pattern (12) to which the connection conductors (4) of the IC (1) are connected and which is electrically connected to a second conductor pattern (13) present on the other side of the substrate (11) and provided with contact bumps (5).

Figure 1:
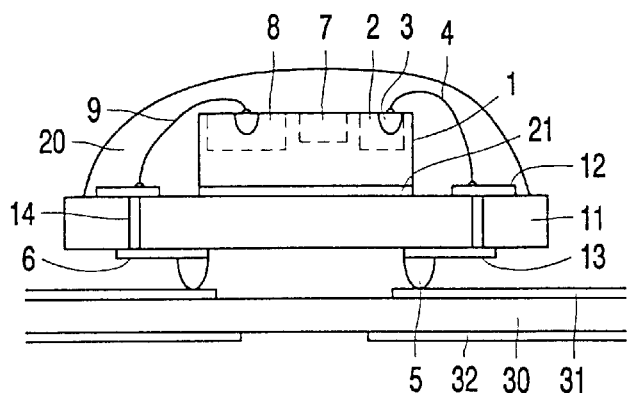

A device (10) according to the invention is provided with one or more fuses (6) and with an electrical component (7), a property of which can be adjusted by means of the fuses (6), which component (7) forms part of the IC (1), and the fuses (6) form part of the conductor patterns (12, 13) on the insulating substrate (11). Such a device is very compact and its manufacture is easy and inexpensive. There is no need to supply the end user with any information regarding the calibration of the device (10). The fuses (6) preferably are conductor tracks (6) comprising constrictions, and they are preferably positioned between the contact bumps (5) present in the form of a matrix. The substrate (11) preferably is a foil (11).

16 Claims, 2 Drawing Sheets

SEMICONDUCTOR DEVICE AND METHOD OF MANUFACTURING SAME

The invention relates to a semiconductor device comprising a semiconductor body provided with one or more semiconductor elements having one or more contact regions provided with connection conductors, the semiconductor body being attached to a side of an insulating substrate which is provided, on said side, with a first conductor pattern to which the connection conductors are connected and which is electrically connected to a second conductor pattern, which is situated on the other side of the insulating substrate and provided with contact bumps. Such a device is compact, inexpensive and easy to manufacture, and it is employed, for example, in the field of telecommunications. The invention also relates to a method of manufacturing such a device.

Such a device is disclosed in United States patent specification U.S. Pat. No. 5,726,489, published on Mar. 10, 1998. In said document, a description is given of a device wherein an IC (=Integrated Circuit) is secured with its connection regions to a conductor pattern of an insulating film which is provided on the other side with a conductor pattern comprising contact bumps which are connected to the conductor pattern on the other side of the film.

A drawback of the known device resides in that it is less suitable for certain ICs, particularly ICs which must be calibrated after they have been manufactured. This requires features which render the device more expensive and less compact.

Therefore, it is an object of the invention to provide a device which is very suitable for ICs which must be calibrated and which is also compact and inexpensive.

To achieve this, a device of the type mentioned in the opening paragraph is characterized in accordance with the invention in that the device is provided with one or more fuses and with an electronic component, a property of which can be adapted by means of the fuses, which component forms part of the semiconductor body, and the fuses form part of one of the conductor patterns on the insulating substrate. The invention is based first of all on the recognition that the various customary calibrating methods, wherein calibration means are incorporated in the semiconductor body, such as PROMs (=Programmable Read Only Memory), fuses or Zener diodes by means of which an electronic component is adjusted, lead to the above-mentioned problem. These methods take up a part of the surface of the semiconductor body, as a result of which the device is less compact and less cheap. The use of PROMs has the additional drawback that the calibration must be carried out by the customer which, for this reason, must be supplied with (measuring) data. In addition, the use of PROMs requires special process steps rendering the production process of the IC more expensive. Said drawback is also attached to the use of Zener diodes or fuses. The invention is further based on the recognition that fuses can be readily provided in one of the conductor patterns of the insulating substrate. This does not make the device more expensive or less compact, and it does not have the above-mentioned further drawbacks of the known methods. In addition, the device in accordance with the invention has the advantage that adjusting the component can very suitably take place after the IC and the connection conductors have been surrounded by an insulating synthetic resin envelope. The reason for this being that melting of fuses may involve contamination of the IC. In addition, the calibration of a finished product is more reliable and hence more accurate.

In a preferred embodiment, the fuses form part of the second conductor pattern. As a result, viewed in projection, the fuses may be situated, on the one hand, at the location of the semiconductor body, enabling the device to be very compact. In addition, the fuses remain outside a possible synthetic resin envelope of the semiconductor body and the connection conductors. Preferably, the fuses comprise a conductor track provided with a constriction and situated between two contact bumps. By virtue thereof, melting of the fuse can take place in a simple manner, namely by being energized. In addition, this can be readily carried out in the test phase of the device by making use of the customary test equipment. The contact bumps can readily be used to electrically connect the fuse.

In a very important embodiment, the insulating substrate comprises an insulating foil. Apart from the fact that the device is very compact by virtue of the small thickness of the foil, the use of a foil also enables fuses to be employed having a very narrow conductor track, for example in the range from 5 to 50 $\mu$m, which is a necessary condition for melting fuses using as little current and power as possible. A suitable thickness of the fuses ranges from 0.1 to 2 $\mu$m. By virtue thereof, damage to the device caused by said melting of the fuses can be precluded. A suitable thickness of the foil lies in the range between 50 and 200 $\mu$m. Preferably, the contact bumps are provided in the form of a two-dimensional matrix on the substrate. This enables a large number of fuses to be provided at a location that can be freely selected.

In a particularly suitable embodiment, the component comprises a number of sub-components which can be short-circuited by means of switches which are connected to a decoder circuit which is connected to the fuses by means of which a binary signal can be sent to the decoder circuit. The decoder circuit is used to convert the data coded by means of the fuses so as to control the switches of the component to be calibrated. The decoder circuit has two sets of inputs, i.e. the natural inputs of the fuses and signal inputs which can be controlled by a test apparatus. In a normal mode, the decoder reads the fuses, and in a test mode, it reads the signal inputs. The calibration procedure takes place, for example, as follows: the decoder is brought into the test mode and the component is controlled by the test apparatus. The setting of the decoder yielding an optimum result for the value of the component is stored as software information in the test apparatus. These values are subsequently used to program the fuses. Finally, the calibration is checked in the normal mode. The calibration setting is then read from the fuses. The result must correspond to the previously found result in the test mode.

Preferably, the semiconductor body is secured with its lower side to the insulating substrate, and the connection conductors comprise an electrically conductive wire connection. This has the advantage that the electric contacts between the IC and the conductor pattern on the, preferably flexible, substrate are better protected against damage than in the situation where, for example, the IC is secured with its active upper side directly to the substrate. The semiconductor body and the wire connections are preferably surrounded by an electrically insulating synthetic resin.

A method of manufacturing a semiconductor device wherein one or more semiconductor elements, provided with one or more contact regions provided with connection conductors, are formed in a semiconductor body, which semiconductor body is secured to a side of an insulating substrate which is provided, on said side, with a first conductor pattern to which the connection conductors are connected and which is electrically connected to a second conductor pattern which is situated on the other side of the insulating substrate and provided with contact bumps, characterized in that the device is provided with one or more fuses and with an electronic component, a property of which can be adapted by means of the fuses, the component is formed in the semiconductor body and the fuses are formed in one of the conductor patterns on the insulating substrate. Preferably, a foil is used for the insulating substrate, and the fuses are provided in the form of a conductor track having a constriction between two contact bumps.

These and other aspects of the invention will be apparent from and elucidated with reference to the embodiment(s) described hereinafter.

Figure 2:
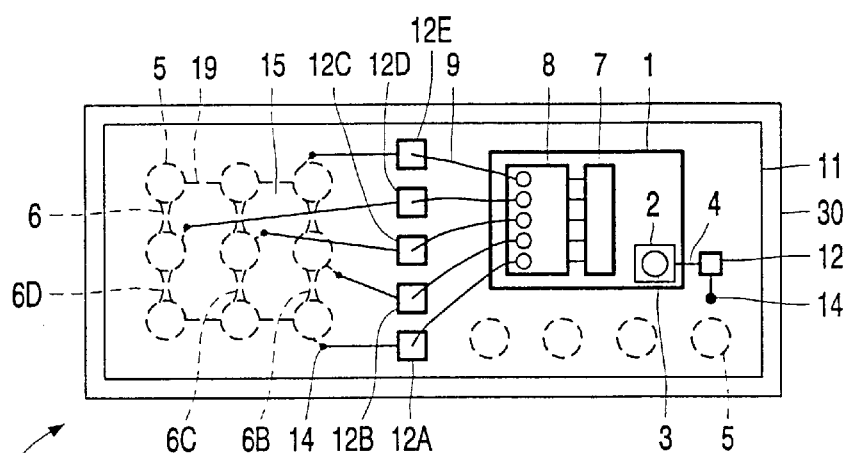
Figure 3:
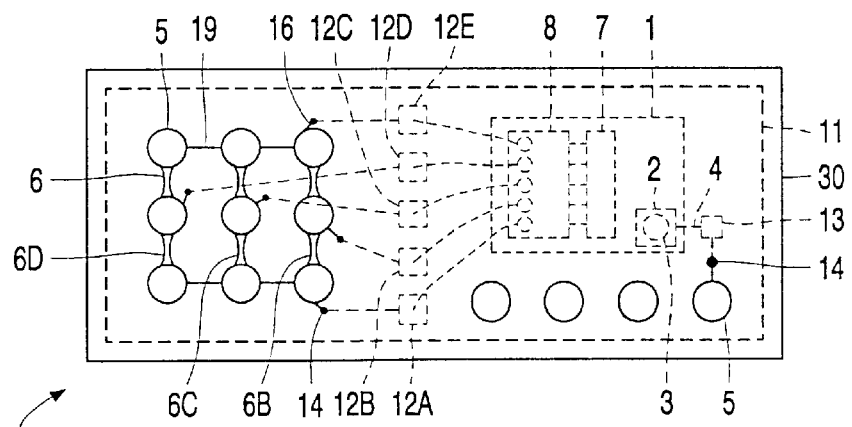
Figure 4:
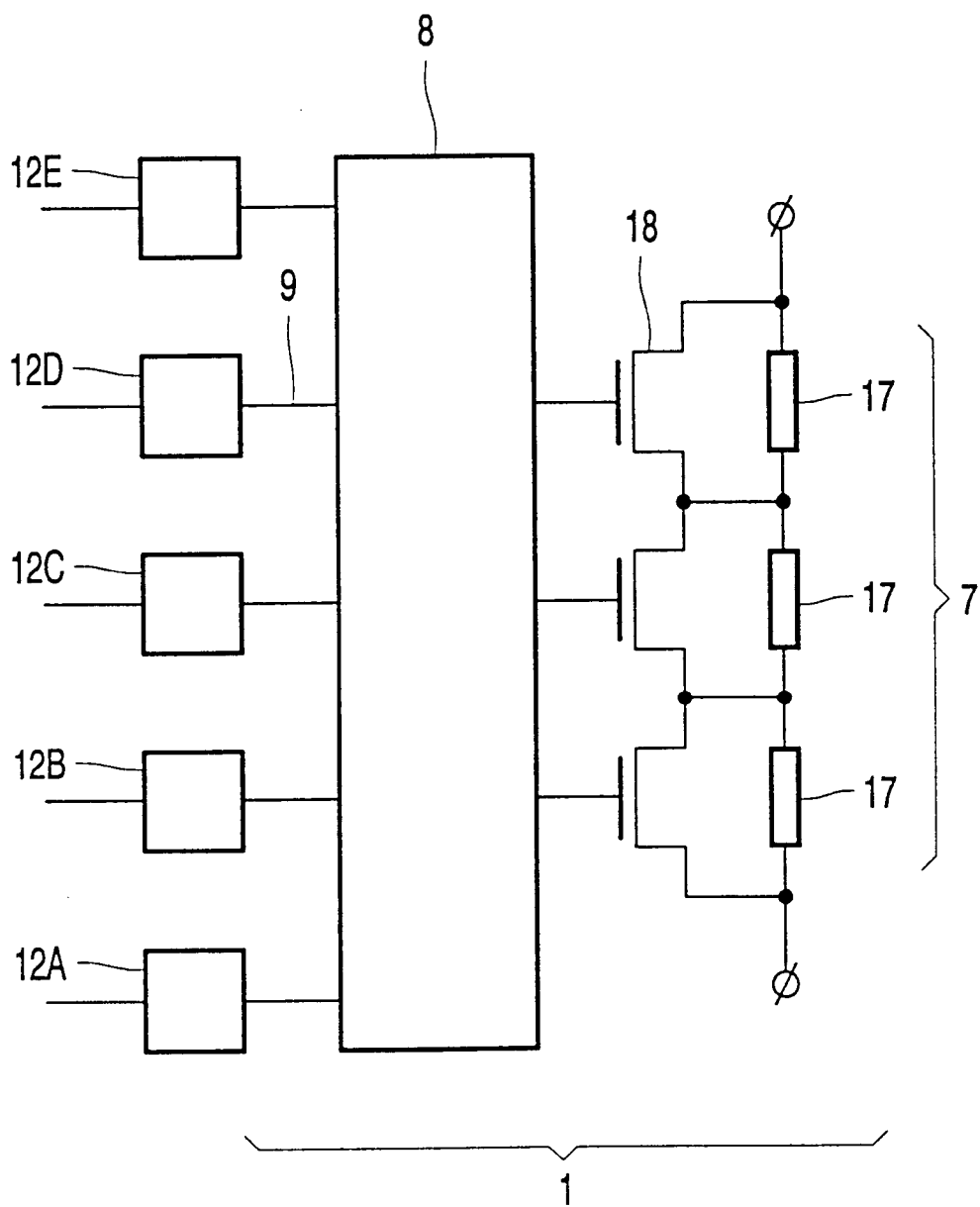

In the drawings:

FIG. 1 is a diagrammatic, cross-sectional view, at right angles to the thickness direction, of an embodiment of a device in accordance with the invention, FIGS. 2 and 3 diagrammatically show, respectively, a plan view and a bottom view of the device shown in FIG. 1, and FIG. 4 diagrammatically shows the circuit of a part of the device shown in FIG. 1.

The figures are diagrammatic and not drawn to scale; particularly the dimensions in the thickness direction being exaggerated for clarity. Corresponding regions or parts bear the same reference numerals whenever possible.

FIG. 1 is a diagrammatic, cross-sectional view, at right angles to the thickness direction, of an embodiment of a device in accordance with the invention. FIGS. 2 and 3 diagrammatically show, respectively, a plan view and a bottom view of the device shown in FIG. 1. The device 10 comprises a semiconductor body 1, in this case a silicon IC 1 comprising one or more semiconductor elements 2 provided with one or more contact regions 3 which, in turn, are provided with connection conductors 4. The IC 1 is secured to an insulating substrate 11 by means of an adhesive layer 21. The substrate 11 is provided, on both sides, with a conductor pattern 12, 13, which conductor patterns are connected to each other by means of conductive feedthroughs 14 and to, respectively, the connection conductors 4 of the IC 1 and contact bumps 5. By means of the contact bumps 5, the device is secured to a printed circuit board 30 provided with conductor patterns 31, 32 which are connected to each other.

In accordance with the invention, the device comprises one or more fuses 6 and an electronic component 7, in this example a resistor 7, a property of which, i.e. the size, can be adapted by means of the fuses 6, and the component 7 forms part of the semiconductor body 1, and the fuses 6 are situated in a conductor pattern 12, 13 on the substrate 11. An IC 1 with an adjustable component 7 is desirable for many applications. As a result, the IC 1 can meet stringent specifications. In this example, using the adjustable resistor 7, a reference voltage can be very accurately set, i.e. more accurately than would be possible on the basis of only the accuracy and reproducibility of the manufacturing process of the IC 1 itself. This is necessary, for example, in a circuit which must supply a very accurate voltage, such as in an IC 1 for mobile telephony. It is well known to carry out such a calibration of the component 7 by means of a PROM accommodated in the semiconductor body 1 or by means of fuses or Zener diodes accommodated in said semiconductor body. However, this has important disadvantages, such as the fact that the IC 1 becomes less compact and more expensive. In the device in accordance with the invention, these drawbacks are overcome or at least substantially overcome. The incorporation of fuses 6 in a conductor pattern 12, 13 already present on the substrate 11 does not lead to additional costs, while the device 10 remains compact and the semiconductor body 1 does not become more expensive. The electronic component 7, for example, in this case, a resistor 7, can be readily integrated in the semiconductor body 1 without particular process steps.

In this example, the fuses 6 are situated in the lower conductor pattern 13 of the substrate 11. As a result, viewed in projection, the fuses 6 can be situated at the location of the substrate 11, thus enabling the device 10 to be compact and free from interference between the fuses 6 and the semiconductor body 1. The fuses 6 comprise a conductor track 6 having a constriction between two contact bumps 5 which, in this case, form part of a two-dimensional matrix of contact bumps 5. These contact bumps can be used to melt the fuses 6 in the test phase of the device 10 by means of test equipment that is customarily used in said test phase. The substrate 11 used here is a foil having a thickness of 0.1 mm to of 2 mm. The important advantage of such a thin foil 11 is that the conductor patterns 12, 13 present thereon may have a very fine geometry. This has a very favorable effect on the manufacture of fuses 6, which can be melted very readily and with no risk of (electronic or thermal) damage to the device 10 and the semiconductor body 1.

FIG. 4 diagrammatically shows a part of the semiconductor body 1 of the device 10 shown in FIG. 1. The resistor 7 is divided into sub-resistors 17 which can be short-circuited by means of transistors 18. The transistors 18 are coupled to a decoder switch 8, only diagrammatically shown, which is connected to connection regions 12A, 12B, 12C forming part of conductor pattern 12. By virtue thereof, in the test phase an optimum setting of the resistor 7 can be sought in a purely electronic manner and without irreversible measures such as melting of a fuse 6. After such an optimum setting has been found, the corresponding fuses 6 can be melted. The end user of the device can subsequently call this optimum setting in a simple manner and without the necessity of specific information. All this will be explained with reference to FIGS. 2 and 3.

The decoder circuit 9, see FIG. 2, is connected via wires 9 to the connection regions 12A through 12E. From said connection regions, conductor tracks 15 extend to vias 14 which, see FIG. 3, are connected, on the other side of the substrate 11, to the contact bumps 5 by means of further conductor tracks 16, which contact bumps are provided in the form of a matrix, and which are only partly shown in the Figures. Between—a number of—the contact bumps 5 there are conductor tracks 6 which are provided with a constriction and which form fuses 6. In this example, a number of the contact bumps 5 are connected to each other by "ordinary" conductor tracks 19. In this manner, the three connection regions 12B, 12C and 12D are connected to fuses 6B, 6C and 6D which can be melted in 8 ways corresponding to the following 8 binary codes: 000, 100, 010, 001, 110, 011, 101 and 111. Thus, the codes are actually stored in the fuses 6. When the device 100 is electrically connected, for example to store software in said device, the proper code necessary to calibrate the component 7 can thus be automatically passed on to the decoding circuit 8 by the (end) user. In this example, the connection region 12E serves as a signal connection region which is grounded by means of a resistor of, for example, 100 k$\Omega$, which is not shown in the drawing. It is thus achieved that a melted fuse 6B, 6C, 6D corresponds to a 0. A fuse 6B, 6C, 6D which is not melted corresponds to a 1.

The device 100 of this example is manufactured as follows. The semiconductor body 1 is provided in a customary manner with the desired circuit which, in this case, comprises transistors 2, the adjustable resistor 7 and the decoder circuit 8. Subsequently, the semiconductor body 1 is bonded to the foil 11 by means of an adhesive layer which is a good thermal conductor and which may or may not be an electric conductor. The foil 11 is previously provided with the desired conductor patterns 12, 13 and via 14, the lower conductor pattern 13 being provided with a matrix of contact bumps 5 between which fuses 6 are formed at the desired locations. Subsequently, wire connections 4, 9 are formed, for example by means of thermocompression, between the IC 1 and the conductor pattern 12. Next, the foil 11 provided with ICs 1 is introduced into a casting apparatus wherein the IC 1 and the wire connections 4, 9 are surrounded by a synthetic resin envelope 20, in this case an epoxy synthetic resin 20. Subsequently, the foil 11 is sawn into pieces which each comprise one IC 1. In the course of a subsequent test phase, wherein use is made of the transistors 18, it is established in which way the component 7 can be optimally calibrated. In a corresponding manner, the fuses 6 are subsequently melted or not. Next, each piece of foil 11 provided with an IC 1 is ready for final assembly, for example on a PCB 30.

The invention is not limited to the example described herein, because, within the scope of the invention, many variations and modifications are possible to those skilled in the art. For example, other dimensions and materials can be used. It is also possible to employ a different geometry. And variations and modifications are also possible as regards the method of manufacturing described herein. The electronic component mentioned in the example may be, for example, an adjustable capacitor instead of an adjustable resistor. Parts of the electronic component may be parallel-connected instead of series-connected. Furthermore, one or more of the conductor patterns on the insulating substrate may be multilayer patterns, thus enabling conductor patterns to intersect. The number of fuses and contact bumps may be smaller than indicated in the example.

In the example given herein, three calibration bits are formed by means of three fuses, four contact regions and contact bumps, and so-called "pull down" resistors in the decoder circuit. Another important modification corresponds to the so-called "keypad" decoding. In said keypad decoding, for example, four calibration bits can be formed by means of four fuses and also only four connection regions and contact bumps. In this case, two of these regions form the signal inputs and the other two regions form inputs of the fuses. Each one of the latter inputs is connected to one of the signal inputs by means of two parallel-arranged fuses.

What is claimed is:

1. A semiconductor device comprising a semiconductor body provided with one or more semiconductor elements having one or more contact regions provided with connection conductors, said semiconductor body being attached to a first side of an insulating substrate which is provided, on said first side, with a first conductor pattern to which said connection conductors are connected and which is electrically connected to a second conductor pattern, which is situated on a second side, opposite said first side of said insulating substrate and provided with contact bumps, wherein said device is provided with one or more fuses and with an electric component, a property of which can be adapted by means of said fuses, which component forms part of said semiconductor body, and said fuses form part of one of said conductor patterns on said insulating substrate.

2. The semiconductor device of claim 1, wherein said fuses form part of said second conductor pattern.

3. The semiconductor device of claim 1, wherein said fuses have a conductor track which is provided with a constriction and is situated between said contact bumps.

4. The semiconductor device of claim 1, wherein said insulating substrate has an insulating foil.

5. The semiconductor device of claim 1, wherein said contact bumps are present in the form of a matrix of contact bumps.

6. The semiconductor device of claim 1, wherein said component has a number of sub-components which can be short-circuited by means of switches which are connected to a decoder circuit which is connected by means of further connection conductors to said fuses by means of which a binary signal can be sent to said decoder circuit.

7. The semiconductor device of claim 1, wherein said semiconductor body is secured with its lower side to said insulating substrate, and said connection conductors has an electrically conductive wire connection.

8. The semiconductor device of claim 1, wherein said semiconductor body and said connection conductors are surrounded by an electrically insulating synthetic resin envelope.

9. A semiconductor device comprising:

a semiconductor body with one or more semiconductor elements having one or more contact regions provided with connection conductors;

an insulating substrate having at least one first conductor pattern on a first side thereof and at least one second conductor pattern on a second side thereof, said second conductor pattern having contact bumps;

one or more fuses forming part of said first conductor pattern and/or said second conductor pattern; and an electronic component having a property that can be modified by said fuses, said electronic component forming part of said semiconductor body, wherein said semiconductor body is connected to said first side of said insulating substrate, said first conductor pattern is connected pattern is electrically connected to said second conductor pattern os electrically connected to said first conductor pattern.

10. The semiconductor device of claim 9, wherein said one or more fuses have a narrow conductor track which has a constriction and is situated between said contact bumps.

11. The semiconductor device of claim 9, wherein said insulating substrate has an insulating foil.

12. The semiconductor device of claim 9, wherein said contact bumps form a matrix.

13. The semiconductor device of claim 9, wherein said component has a number of sub-components which can be short-circuited by one or more switches connected to a decoder circuit which is connected by further connection conductors to said one or more fuses such that a binary signal can be sent to said decoder circuit.

14. The semiconductor device of claim 9, wherein said semiconductor body is secured with a lower side thereof to said insulating substrate, and said connection conductors have an electrically conductive wire connection.

15. The semiconductor device of claim 9, wherein said semiconductor body and said connection conductors are surrounded by an electrically insulating synthetic resin envelope.

16. A semiconductor device comprising:

a semiconductor body with one or more semiconductor elements having one or more contact regions provided with connection conductors;

an insulating substrate with a first conductor pattern on a first side thereof and a second conductor pattern on a second side thereof, said second conductor pattern being provided with contact bumps;

one or more fuses forming part of said first conductor pattern and/or said second conductor pattern, with at least one of said one or more fuses remaining outside of a synthetic resin envelope surrounding said first conductor pattern and/or said second conductor pattern;

an electronic component having a property that can be modified by said fuses, said electronic component forming part of said semiconductor body, wherein said semiconductor body is connected to said first side of said insulating substrate, said first conductor pattern is connected to said connection conductors, and said second conductor pattern is electrically connected to said first conductor pattern.

* * * * *

UNITED STATES PATENT AND TRADEMARK OFFICE
CERTIFICATE OF CORRECTION

PATENT NO.     : 6,590,284 B2
DATED          : July 8, 2003
INVENTOR(S)    : Hermanus Johannes Effing et al.

It is certified that error appears in the above-identified patent and that said Letters Patent is hereby corrected as shown below:

<u>Title page,</u>
Item [73], Assignee, insert:
-- [73] Assignee: Koninklijke Philips Electronics N.V., Eindhoven (NL) --.

Signed and Sealed this

Second Day of December, 2003

JAMES E. ROGAN
*Director of the United States Patent and Trademark Office*